United States Patent
Yoshimi

(10) Patent No.: US 10,070,563 B2
(45) Date of Patent: Sep. 4, 2018

(54) ELECTRONIC CONTROL UNIT

(71) Applicant: DENSO CORPORATION, Kariya-city, Aichi-pref. (JP)

(72) Inventor: Tomoaki Yoshimi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/090,159

(22) Filed: Apr. 4, 2016

(65) Prior Publication Data

US 2016/0295680 A1    Oct. 6, 2016

(30) Foreign Application Priority Data

Apr. 6, 2015 (JP) .................................. 2015-077731

(51) Int. Cl.
*H05K 7/20* (2006.01)

(52) U.S. Cl.
CPC ......... *H05K 7/209* (2013.01); *H05K 7/20454* (2013.01)

(58) Field of Classification Search
CPC ............. H05K 7/20454; H05K 1/0203; H05K 7/20854; H05K 2201/066; H05K 7/2039; H05K 7/209

See application file for complete search history.

(56) References Cited

U.S. PATENT DOCUMENTS 6,549,409 B1 *   4/2003   Saxelby, Jr. ......... H05K 1/0203
                                                                    165/185
6,628,526 B1 *   9/2003   Oshima ................ H01L 21/561
                                                                    174/541
8,587,945 B1 * 11/2013   Hartmann .......... H05K 7/20454
                                                                    361/679.53
2010/0254093 A1  10/2010  Oota et al.
2011/0012256 A1   1/2011  Oota
2011/0013370 A1   1/2011  Oota
2011/0090625 A1   4/2011  Oota
2011/0304248 A1  12/2011  Oota (Continued)

FOREIGN PATENT DOCUMENTS

| JP | H02-090555 | 3/1990 |
| JP | H11-345920 | 12/1999 |
| JP | 2005-142292 | 6/2005 |

*Primary Examiner* — James Wu
*Assistant Examiner* — Hung Dang
(74) *Attorney, Agent, or Firm* — Knobbe, Martens, Olson & Bear, LLP

(57) ABSTRACT

A substrate is fixed to a housing. Heating elements are mounted on a surface of the substrate on the housing-side. A radiating component is provided between the heating elements and the housing. A surface of the housing on the substrate-side includes accommodating recesses, a partitioning wall part, a peripheral wall part, and buffer parts. In each of the accommodating recesses, a corresponding one of the heating elements is accommodated. The partitioning wall part separates the heating elements from each other. The peripheral wall part surrounds the accommodating recesses and the partitioning wall part. Each of the buffer parts is formed between a corresponding one of the accommodating recesses and the peripheral wall part. Each of the buffer parts is formed to be higher than a bottom part of a corresponding one of the accommodating recesses, and to be lower than the peripheral wall part.

6 Claims, 8 Drawing Sheets

(56) References Cited

U.S. PATENT DOCUMENTS

2012/0039054 A1 2/2012 Oota
2012/0326295 A1 12/2012 Oota
2013/0003306 A1 1/2013 Oota et al.
2015/0189794 A1* 7/2015 Tashima ............... B62D 5/0406
                                                                    180/446

* cited by examiner

ELECTRONIC CONTROL UNIT

CROSS REFERENCE TO RELATED APPLICATION

This application is based on Japanese Patent Application No. 2015-77731 filed on Apr. 6, 2015, the disclosure of which is incorporated herein by reference.

TECHNICAL FIELD

The present disclosure relates to an electronic control unit.

BACKGROUND

There has been known an electronic control unit in which electronic components are mounted on a substrate. For example, in JP2011-103446A, electronic components configuring a control part are mounted on a substrate surface on a side opposite to a side close to a cap to which the substrate is fixed.

In JP2011-103446A, heat, which is caused by, for example, current application to an electronic component, is radiated through a substrate toward a cap formed of aluminum or the like. While a radiating component such as a radiating gel may be provided between a heating component that generates heat and a component that receives the heat from the heating component, the cap in JP2011-103446A is provided without consideration of disposition of the radiating component.

SUMMARY

The present disclosure addresses at least one of the above issues. Thus, it is an objective of the present disclosure to provide an electronic control unit that allows the radiating component to be appropriately disposed.

To achieve the objective of the present disclosure, there is provided an electronic control unit including a substrate, a housing, a plurality of heating elements, and a radiating component. The substrate is fixed to the housing. The plurality of heating elements are mounted on a surface of the substrate on the housing-side. The radiating component is provided between the plurality of heating elements and the housing. A surface of the housing on the substrate-side includes a plurality of accommodating recesses, a partitioning wall part, a peripheral wall part, and a plurality of buffer parts. In each of the plurality of accommodating recesses, a corresponding one of the plurality of heating elements is accommodated. The partitioning wall part separates the plurality of heating elements from each other. The peripheral wall part surrounds the plurality of accommodating recesses and the partitioning wall part. Each of the plurality of buffer parts is formed between a corresponding one of the plurality of accommodating recesses and the peripheral wall part. Each of the plurality of buffer parts is formed to be higher than a bottom part of a corresponding one of the plurality of accommodating recesses, and to be lower than the peripheral wall part.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Hereinafter, an electronic control unit according to the disclosure is described with reference to the accompanying drawings. In the following embodiments, substantially the same configuration is designated by the same numeral, and duplicated description is omitted.

First Embodiment

A first embodiment is described with reference to FIGS. 1 to 6. Any of the drawings in the first embodiment is a schematic drawing to illustrate a distinctive characteristic; hence, an aspect ratio or the like is appropriately modified, or description of some components is omitted. The same holds true for the drawings in subsequent embodiments.

Figure 5:
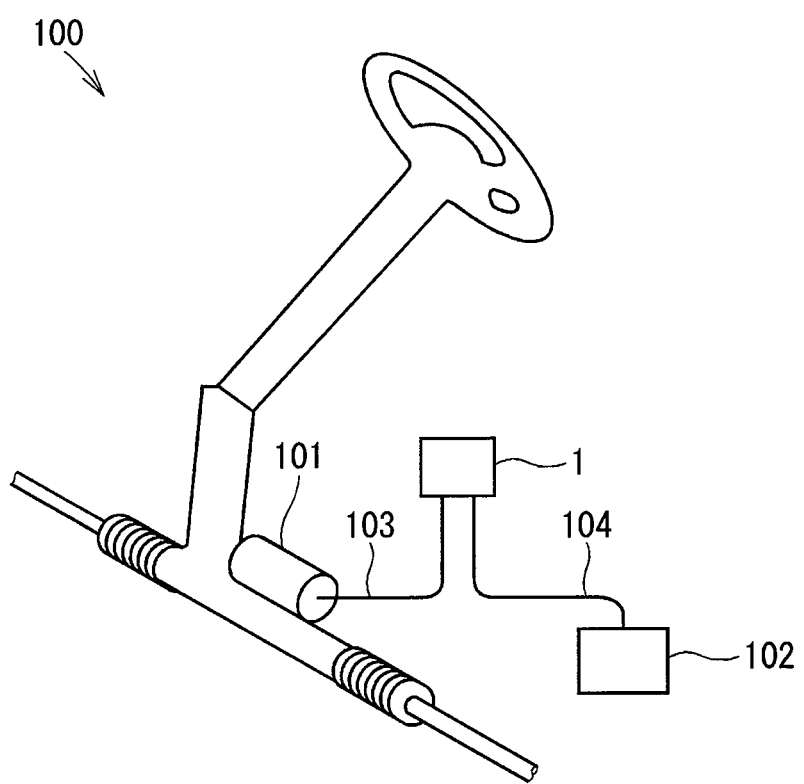
FIG. 5 is a schematic illustration of an electromotive power steering system according to the first embodiment.

As illustrated in FIG. 5, an electronic control unit 1 of the first embodiment is applied to an electromotive power steering system 100 of a vehicle, and controls operation of a motor 101 that generates assist torque assisting steering by a driver according to a steering torque signal, a vehicle speed signal, and the like. The motor 101 in the first embodiment is a DC brush motor. The electronic control unit 1 is connected to the motor 101 by a harness 103 and connected to a battery 102 by a harness 104.

Figure 1:
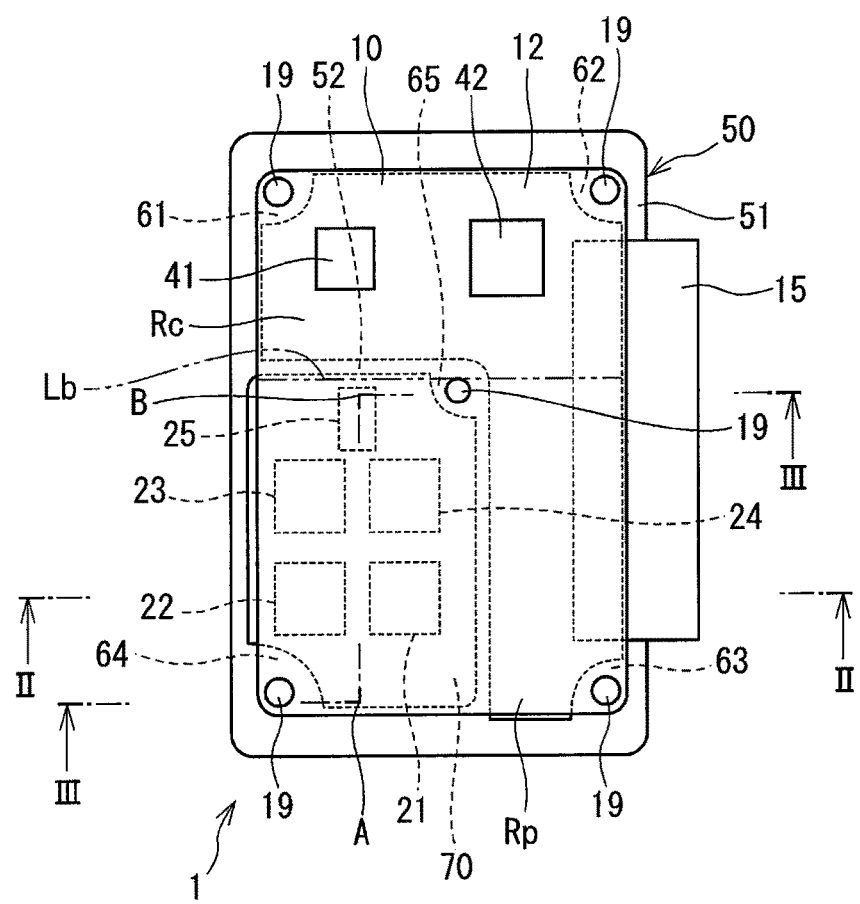
FIG. 1 is a plan view of an electronic control unit according to a first embodiment.
Figure 2:
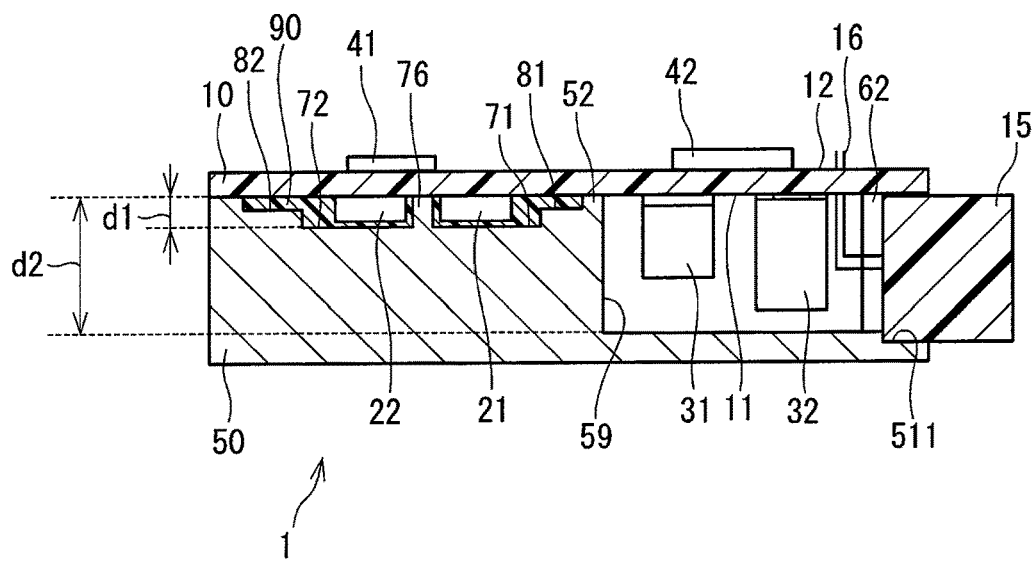
FIG. 2 is a sectional view along a line II-II in FIG. 1.
Figure 3:
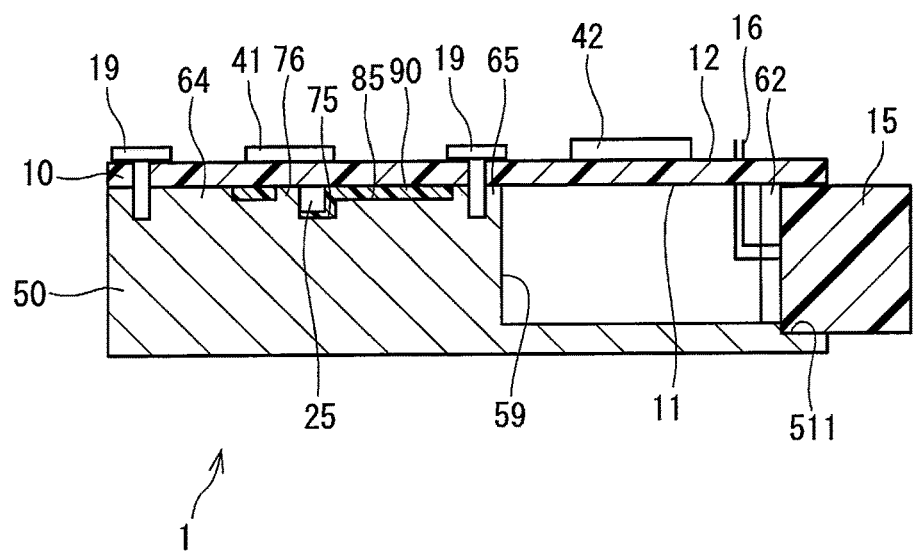
FIG. 3 is a sectional view along a line III-A-B-III in FIG. 1.

As illustrated in FIGS. 1 to 3, the electronic control unit 1 includes a substrate 10, switching elements 21 to 24, a shunt resistance 25, a housing 50, a radiating component 90, and the like. In FIGS. 2 and 3, each electronic component mounted on the substrate 10 is not hatched. The same holds true for sectional views in subsequent embodiments.

Figure 6:
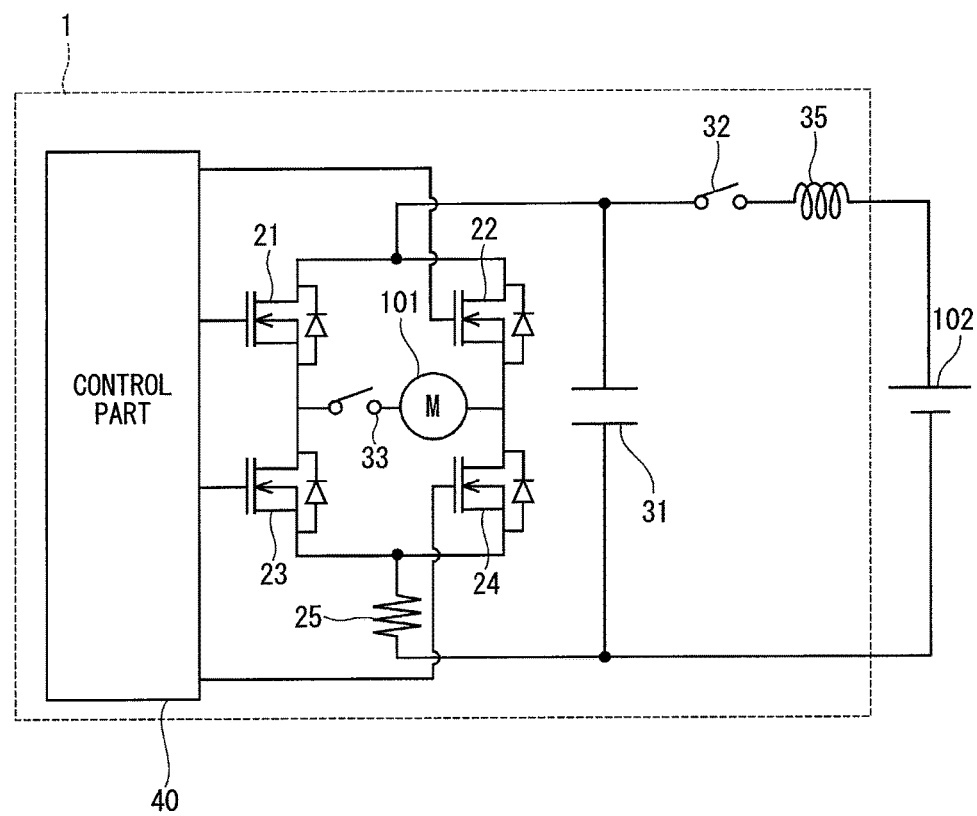
FIG. 6 illustrates an electrical configuration of the electronic control unit according to the first embodiment.

A circuit configuration of the electronic control unit 1 is now described with reference to FIG. 6. The motor 101 in FIG. 6 is shown in the inside of the electronic control unit 1 for convenience while being actually provided outside thereof. The switching elements 21 to 24 each perform on-off operation while being controlled according to a control signal from the control part 40. The control part 40 controls the on-off operation of each of the switching elements 21 to 24 and thus controls operation of the motor 101. Although the switching elements 21 to 24 are each a metal-oxide-semiconductor field-effect transistor (MOSFET) in the first embodiment, the switching element may be an insulated gate bipolar transistor (IGBT) or the like.

The switching elements 21 to 24 are in an H bridge connection. In detail, the switching elements 21 and 23 are connected in series, while the switching elements 22 and 24 are connected in series. The switching elements 21 and 23 connected in series are connected in parallel with the switching elements 22 and 24 connected in series. The node of the switching elements 21 and 22 connected to a high potential side is connected to the positive electrode of the battery 102 via a power relay 32 and the coil 35. The node of the switching elements 23 and 24 connected to a low potential side is connected to the negative electrode of the battery 102 via the shunt resistance 25. A motor relay 33 and the motor 101 are connected between the node of the switching elements 21 and 23 and the node of the switching elements 22 and 24. In the first embodiment, each of the power relay 32 and the motor relay 33 is a mechanically structured, mechanical relay.

The shunt resistance 25 detects a current applied to the motor 101. The capacitor 31 is, for example, an aluminium electrolytic capacitor, and is connected in parallel with the battery 102. The capacitor stores electrical charges, and thereby assists power supply to the switching elements 21 to 24, and suppresses noise components such as a surge voltage. The coil 35 is, for example, a chalk coil, and is connected between the battery 102 and the power relay 32 so as to reduce noise.

The control part 40 includes a microcomputer 41 and a custom IC 42 (see FIGS. 1 to 3). Each of the microcomputer 41 and the custom IC 42 is a semiconductor package including CPU, ROM, RAM, and I/O, for example. The control part 40 controls each of operations of the relays 32 and 33 and the switching elements 21 to 24. The control part 40 controls operation of the switching elements 21 to 24 according to signals from sensors provided in various parts of a vehicle, and thereby controls rotation of the motor 101.

As illustrated in FIGS. 1 to 3, the switching elements 21 to 24, the shunt resistance 25, the capacitor 31, the relays 32 and 33, the coil 35, the microcomputer 41, and the custom IC 42 are mounted on the substrate 10. In the first embodiment, the substrate 10 has a first surface 11 on a side close to the housing 50, and a second surface 12 on a side opposite to the side close to the housing 50. A connector 15 used for connection to the motor 101 and the battery 102 is fixed to the first surface 11 of the substrate 10. The connector 15 is used for connection to the motor 101, the battery 102, various sensors, and the like. The connector 15 has a connector pin 16. The connector pin 16 is inserted into the substrate 10 and electrically connected to the substrate 10 by solder or the like. FIG. 1 omits the connector pin 16. The same holds true for FIGS. 7, 9, and 11 described later.

For example, the substrate 10 is a printed circuit board such as a FR-4 board configured of fibrous glass and epoxy resin, and is formed into a roughly rectangular shape. The substrate 10 has holes at places corresponding to substrate fixing parts 61 to 65 as described later, and substrate fixing screws 19 as fixing components are inserted into the holes. The substrate 10 is divided into two regions by a two-dot chain line Lb, i.e., power region Rp and control region Rc.

The switching elements 21 to 24 and the shunt resistance 25, the capacitor 31, the relays 32 and 33, and the coil 35 (the motor relay 33 and the coil 35 are also not shown in FIG. 2) are mounted on the first surface 11 of the power region Rp. The switching elements 21 to 24 and the shunt resistance 25 are disposed in a radiating part 70 of the housing 50 so as to allow heat radiation. In the first embodiment, the switching elements 21 to 24 and the shunt resistance 25 correspond to "heating elements", and are appropriately referred to as "heating elements 21 to 25" below. The capacitor 31, the relays 32 and 33, and the coil 35 are mounted in a region between the portion where the heating elements 21 to 25 are mounted and the portion where the connector 15 is fixed.

The microcomputer 41 and the custom IC 42 are mounted on the second surface 12 of the control region Rc. The microcomputer 41 and the custom IC 42 are mounted not in the power region Rp but in the control region Rc, thereby such control components can be less affected by noise caused by a large current applied to power components such as the switching elements 21 to 24.

As illustrated in FIGS. 1 to 4, the housing 50 is generally formed into a roughly rectangular shape in a plan view with a material having high heat conductance such as aluminum. The housing 50 has an outer wall part 51 rising along the outer edge thereof on the side on which the substrate 10 is fixed to the housing 50. The outer wall part 51 has a cutout 511 in alignment with the shape of the connector 15 that is disposed in the cutout 511.

Figure 4:
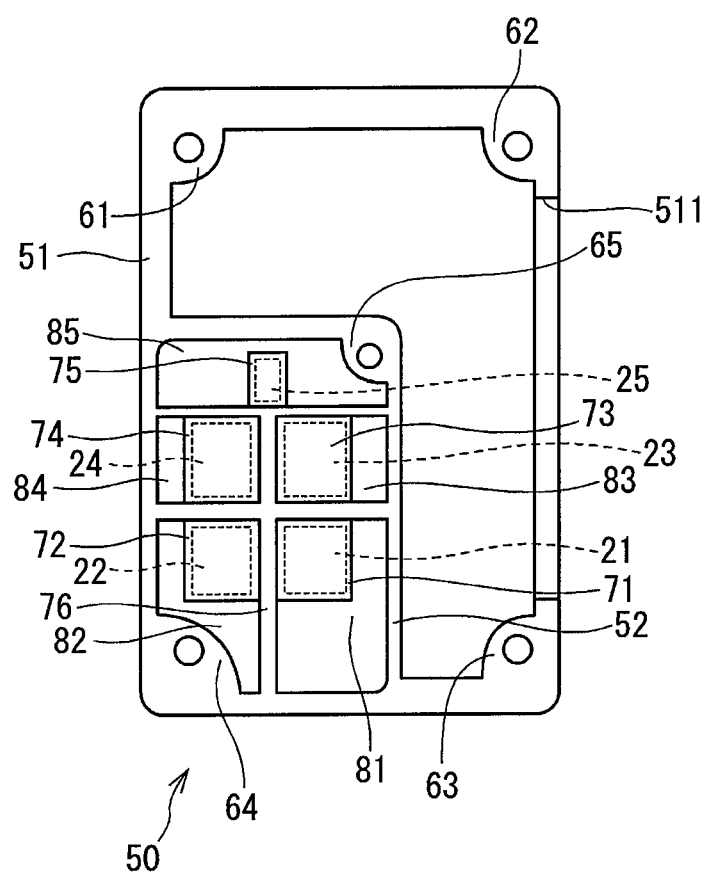
FIG. 4 is a plan view of a housing according to the first embodiment.

The housing 50 has a peripheral wall part 52 surrounding a region in which the heating elements 21 to 25 are disposed. The peripheral wall part 52 is provided with a height equal to that of the outer wall part 51. The radiating part 70 is a region surrounded by the peripheral wall part 52. In the first embodiment, the radiating part 70 is formed into a roughly rectangular shape in a plan view. As illustrated in FIGS. 1 and 4, in the first embodiment, part of the peripheral wall part 52 is formed integrally with the outer wall part 51. Specifically, the peripheral wall part 52 is formed integrally with the outer wall part 51 on a side of the radiating part 70 opposite to a side close to the connector 15 and on a side thereof opposite to a side close to the control region Rc.

An accommodating room 59 is provided between the radiating part 70 and the connector 15 (see FIGS. 2 and 3). The accommodating room 59 accommodates the capacitor 31, the relays 32 and 33, and the coil 35 that are components larger than the heating elements 21 to 25. In the first embodiment, the capacitor 31, the relays 32 and 33, and the coil 35, which are relatively large components, are mounted on a surface of the substrate 10 on a side close to the housing 50 and accommodated in the accommodating room 59, thereby thermal mass of the radiating part 70 can be sufficiently provided. In the first embodiment, the capacitor 31, the relays 32 and 33, and the coil 35 each correspond to "large component".

The substrate fixing parts 61 to 64 are each protrusively provided from a corner of the housing 50 to the inside. It may be understood that the substrate fixing part 64 is protrusively provided from the peripheral wall part 52 toward the radiating part 70. The substrate fixing part 65 is protrusively provided toward the radiating part 70 at a place that is a corner of the peripheral wall part 52 diagonally opposed to the substrate fixing part 64. In the first embodiment, the substrate fixing parts 64 and 65 are considered to be provided in the peripheral wall part 52. The substrate fixing parts 61 to 65 are provided with the same height and are in contact with the first surface 11 of the substrate 10. An interconnection artwork is designed such that the portion of the substrate 10 in contact with the housing 50 has an electrical potential equal to the ground potential to restrain a ground fault. A substrate fixing screw 19 is threaded into each of the substrate fixing parts 61 to 65. Consequently, the substrate 10 is fixed to the housing 50. The heating elements 21 to 25 are each separated from the housing 50 while the substrate 10 is fixed to the housing 50.

Accommodating recesses 71 to 75 that accommodate the heating elements 21 to 25, respectively, are provided in the radiating part 70. In the first embodiment, each of the accommodating recesses 71 to 75 in the radiating part 70 has a depth shallower than that of the accommodating room 59.

In other words, a distance d1 from the bottom of each of the accommodating recesses 71 to 75 to the end face of the housing 50 on a side close to the substrate 10 is smaller than a distance d2 from the bottom of the accommodating room 59 to the end face of the housing 50 on the side close to the substrate 10. That is, d1<d2 is given.

A partition wall part 76 is provided between the accommodating recesses 71 to 75. Hence, the heating elements 21 to 25 are each disposed in a space isolated by the partition wall part 76 in the radiating part 70. In the first embodiment, the partition wall part 76 is provided with a height equal to that of the outer wall part 51 or the peripheral wall part 52. Respective buffer parts 81 to 85 are provided between the respective accommodating recesses 71 to 75 and the peripheral wall part 52. Each of the buffer parts 81 to 85 is provided higher than the bottom of each of the accommodating recesses 71 to 75 and lower than the peripheral wall part 52. In the first embodiment, the buffer parts 81 to 85 are provided over the entire inner circumference of the peripheral wall part 52 except for connections with the partition wall part 76. Although configurations of the heating elements 21 to 25 and the housing 50 mounted on the first surface 11 of the substrate 10 are shown with broken lines in FIG. 1, the partition wall part 76 and the buffer parts 81 to 85 are omitted from FIG. 1 to simplify the drawing. The same holds true for FIGS. 7, 9, and 11.

The radiating part 70 is provided with the radiating component 90 between each of the heating elements 21 to 25 and the housing 50. The radiating component 90 of the first embodiment is a so-called radiating gel. The radiating component 90 transfers heat, which is caused by, for example, current application to the heating elements 21 to 25, to the housing 50 to radiate the heat. In other words, the housing 50 also serves as a heat sink, and the heating elements 21 to 25 are provided so as to allow heat radiation to the housing 50 through the radiating component 90.

In the first embodiment, the heating elements 21 to 25 are accommodated in the accommodating recesses 71 to 75, respectively, partitioned by the peripheral wall part 52 and the partition wall part 76, and the radiating component 90 is provided for each of partitions. Hence, the amount of the radiating component 90 is decreased compared with the case where the heating elements 21 to 25 are disposed in a space that is not partitioned. Moreover, movement of the radiating component 90 can be restricted. In particular, in the first embodiment, since the respective buffer parts 81 to 85 are provided between the respective accommodating recesses 71 to 75 and the peripheral wall part 52, even if slight movement of the radiating component 90 occurs due to an aged deterioration of the radiating component 90, the radiating component 90 does not flow out to the outside of the radiating part 70 beyond the peripheral wall part 52.

The space in which the heating elements 21 to 25 are each disposed is surrounded by the peripheral wall part 52 and the partition wall part 76. Hence, heat from each of the heating elements 21 to 25 can be radiated through back radiation from the surface of each of the heating elements 21 to 25 on a side opposite to a side close to the substrate 10, and can be radiated from the periphery of each heating element to the peripheral wall part 52 and to the partition wall part 76. In the first embodiment, the heating elements 21 to 25 are each formed into a roughly rectangular shape, and the space in which the heating elements 21 to 25 are each accommodated is formed into a roughly rectangular shape by the peripheral wall part 52 and the partition wall part 76; hence, heat from each of the heating elements 21 to 25 is radiated in five directions in total, i.e., the back direction and four peripheral directions. This improves heat radiation efficiency. The heating elements 21 to 25 are disposed one for each space partitioned by the peripheral wall part 52 and the partition wall part 76, making it possible to suppress interference of a magnetic field between the heating elements 21 to 25.

As described in detail above, the electronic control unit 1 includes the substrate 10, the housing 50, the heating elements 21 to 25, and the radiating component 90. The substrate 10 is fixed to the housing 50. The heating elements 21 to 25 are mounted on the surface of the substrate 10 on the side close to the housing 50. The radiating component 90 is provided between each of the heating elements 21 to 25 and the housing 50.

The accommodating recesses 71 to 75, the partition wall part 76, the peripheral wall part 52, and the buffer parts 81 to 85 are provided in the surface of the housing 50 on a side close to the substrate 10. The accommodating recesses 71 to 75 accommodate the heating elements 21 to 25, respectively. The partition wall part 76 isolates the heating elements 21 to 25 from one another. The peripheral wall part 52 surrounds the accommodating recesses 71 to 75 and the partition wall part 76. The respective buffer parts 81 to 85 are provided between the respective accommodating recesses 71 to 75 and the peripheral wall part 52. The buffer parts 81 to 85 are each provided higher than the bottom of each of the accommodating recesses 71 to 75 and lower than the peripheral wall part 52.

In the first embodiment, the heating elements 21 to 25 are each disposed in the space partitioned by the partition wall part 76 and the peripheral wall part 52. The radiating component 90 is therefore disposed in the space partitioned by the partition wall part 76 and the peripheral wall part 52; hence, the amount of the radiating component 90 can be decreased compared with the case where the partitioning wall part 76 and the peripheral wall part 52 are not provided. Since the respective buffer parts 81 to 85 are provided between the respective accommodating recesses 71 to 75 and the peripheral wall part 52, even if the radiating component 90 deteriorates due to aging, the radiating component 90 does not flow out to the outside of the peripheral wall part 52 and thus can be appropriately disposed.

The heating elements 21 to 25 are each disposed in the space partitioned by the partitioning wall part 76 and the peripheral wall part 52; hence, heat can be radiated to the housing 50 from the surface of each of the heating elements 21 to 25 on the side opposite to the side close to the substrate 10 and from the periphery of each of the heating elements 21 to 25, leading to improvement in heat radiation efficiency. This reduces interference of a magnetic field, making it possible to reduce noise.

The housing 50 has the plurality of substrate fixing parts 61 to 65 in contact with the substrate 10 to fix the substrate 10 to the housing 50 by the substrate fixing screws 19. The substrate fixing parts 61 to 65 are provided with the same height that allows the heating elements 21 to 25 to be separated from the housing 50 while the substrate 10 is fixed to the housing 50. This allows the substrate 10 to be appropriately assembled to the housing 50. The radiating component 90 is disposed between each of the heating elements 21 to 25 and the housing 50. The heating elements 21 to 25 are separated from the housing 50, which makes it possible to avoid a short circuit between each of the heating elements 21 to 25 and the housing 50 due to contact therebetween.

The peripheral wall part 52 is provided with at least two substrate fixing parts 64 and 65. This makes it possible to restrain each of the heating elements 21 to 25 from being in contact with the housing 50. In the first embodiment, at least one substrate fixing part 65 is provided at a place separated from the outer edge of the substrate 10. Consequently, the substrate 10 is less likely to be warped, making it possible to restrain each of the heating elements 21 to 24 from being in contact with the shunt resistance 25.

The housing 50 has the accommodating room 59 accommodating the capacitor 31, the relays 32 and 33, and the coil 35, which are large components other than the heating elements 21 to 25. The depth of each of the accommodating recesses 71 to 75 is shallower than the depth of the accommodating room 59. This provides sufficient thermal mass of the radiating part 70, leading to improvement in heat radiation efficiency. The connector 15, which is used for connection to external components (in the first embodiment, the motor 101, the battery 102, and the like), is fixed to the surface of the substrate 10 on the side close to the housing 50. Consequently, it is possible to provide thickness of the housing 50 corresponding to the height of the connector 15 and therefore provide sufficient thermal mass, leading to improvement in heat radiation efficiency.

Second Embodiment

Figure 7:
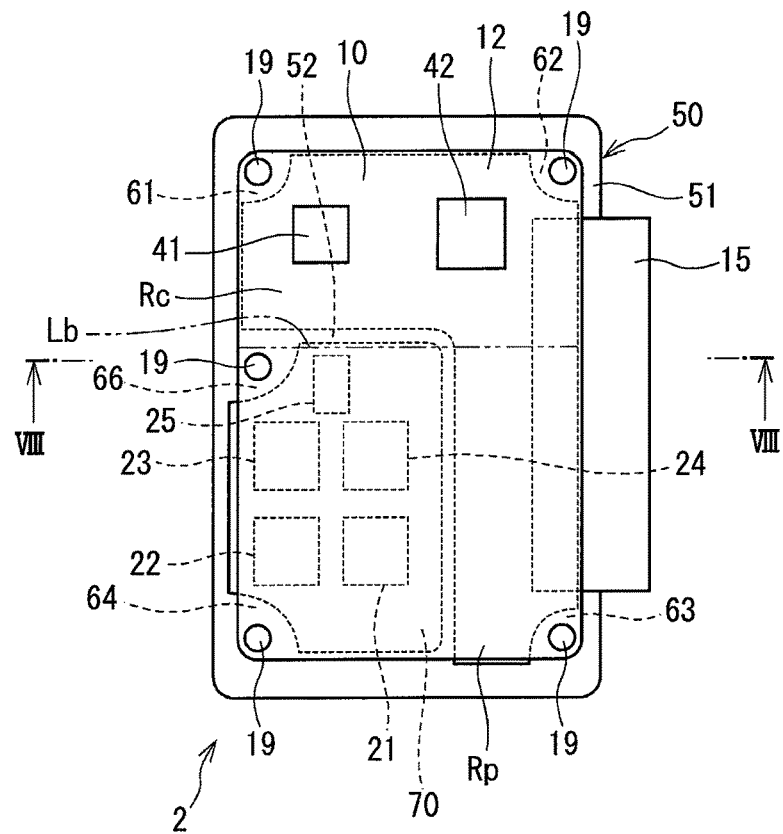
FIG. 7 is a plan view of an electronic control unit according to a second embodiment.
Figure 8:
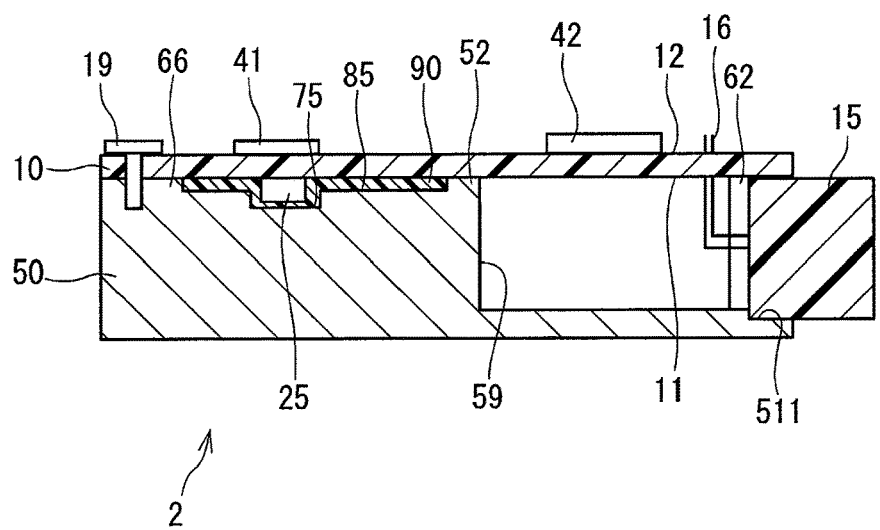
FIG. 8 is a sectional view along a line VIII-VIII in FIG. 7.

A second embodiment is shown in FIGS. 7 and 8. An electronic control unit 2 of the second embodiment is the same as that of the first embodiment except for a formation portion of a substrate fixing part 66. The substrate fixing part 66 of the electronic control unit 2 of the second embodiment is provided at a portion that is a corner of the peripheral wall part 52 and is formed integrally with the outer wall part 51 on a side opposite to a side close to the connector 15. Specifically, as with the first embodiment, the peripheral wall part 52 is provided with the two substrate fixing parts 64 and 66. Such a configuration also provides the effects similar to those in the first embodiment.

Third Embodiment

Figure 9:
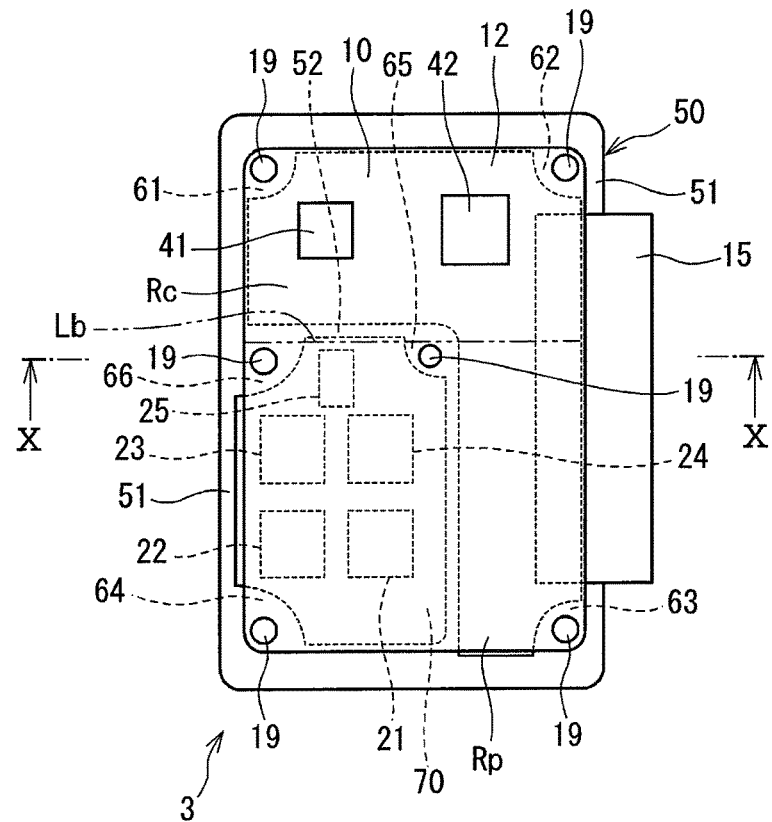
FIG. 9 is a plan view of an electronic control unit according to a third embodiment.
Figure 10:
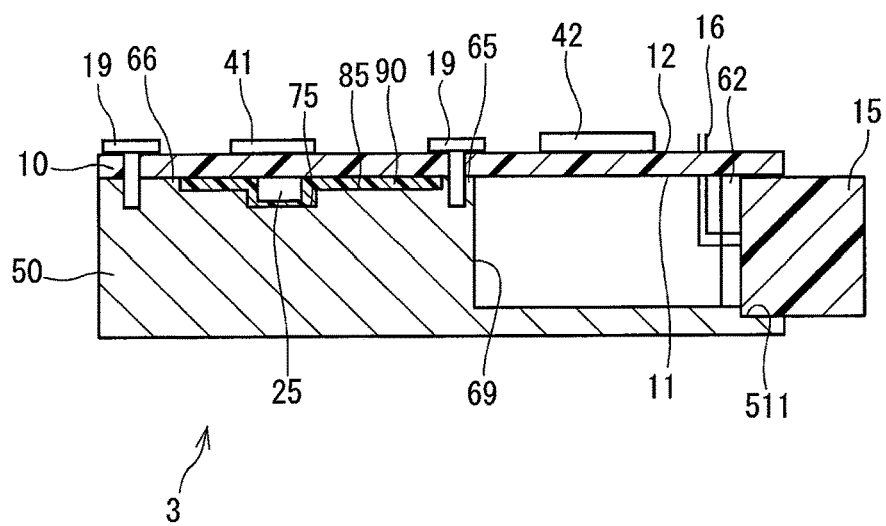
FIG. 10 is a sectional view along a line X-X in FIG. 9.

A third embodiment is shown in FIGS. 9 and 10. The peripheral wall part 52 of an electronic control unit 3 of the third embodiment is provided with three substrate fixing parts 64, 65, and 66. Such a configuration also provides the effects similar to those in the first and second embodiments.

Fourth Embodiment

Figure 11:
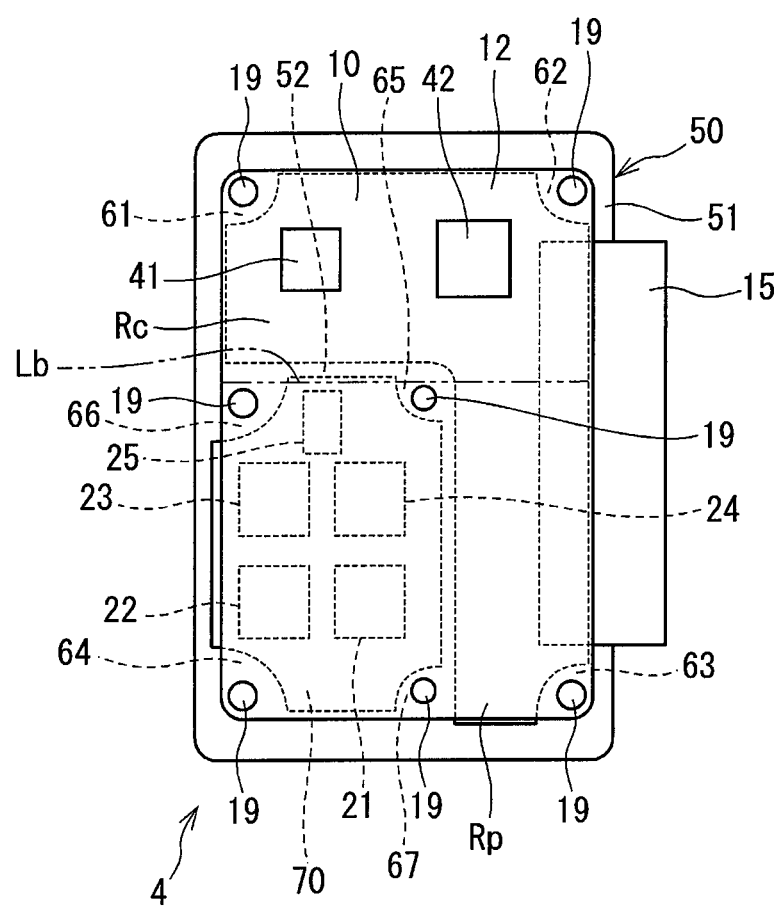
FIG. 11 is a plan view of an electronic control unit according to a fourth embodiment.

A fourth embodiment is shown in FIG. 11. The peripheral wall part 52 of an electronic control unit 4 of the fourth embodiment is further provided with one substrate fixing part 67 in addition to the three substrate fixing parts 64, 65, and 66 of the third embodiment. The substrate fixing part 67 is provided at a portion that is a corner of the peripheral wall part 52 and is formed integrally with the outer wall part 51 on a side opposite to a side close to the control region Rc. Such a configuration also provides the effects similar to those in the first to third embodiments.

Modifications to the above embodiments will be described below.
(A) Heating Component
In the above-described embodiments, the heating element includes a switching element and a shunt resistance. In a modification, the heating element may be one of a switching element and a shunt resistance, or may be another electronic component mounted on a substrate. In the above-described embodiments, the power relay and the motor relay are each a mechanical relay. In a modification, at least one of the power relay and the motor relay may be a semiconductor element such as MOSFET or IGBT. In such a case, the power relay and the motor relay, each being configured of a semiconductor element, are each considered as "heating element", and may be mounted on the first surface of the substrate so that heat is radiated to the housing through the radiating component.
(B) Housing
In the above-described embodiments, part of the peripheral wall part surrounding the radiating part is formed integrally with the outer wall part provided along the outer edge of the housing. In a modification, the entire peripheral wall part may be provided separately from the outer wall part. In the above-described embodiments, the peripheral wall part has a height equal to that of the outer wall part. In a modification, if the substrate fixing parts have the same height, the peripheral wall part may have a height different from that of the outer wall part at a place other than the substrate fixing parts.

In the above-described embodiments, the partitioning wall part has a height equal to height of the peripheral wall part or the outer wall part. In a modification, if the height of the partitioning wall part is higher than the bottom of each accommodating recess, the height may be lower than that of the peripheral wall part or the outer wall part. In the above-described embodiments, each buffer part is provided between each accommodating recess and the peripheral wall part. In a modification, the buffer part may also be provided between each accommodating recess and the partitioning wall part. In the above-described embodiments, the buffer parts as a whole are provided over the entire inner circumference of the peripheral wall part. In a modification, the buffer parts may be formed in portions as part of the inside of the peripheral wall part. In the above-described embodiments, the radiating part is formed into a roughly rectangular shape. In a modification, the radiating part may be a region having a shape other than the rectangular shape.
(C) Substrate
In the above-described embodiments, the heating elements, the capacitor, the relays, and the coil are mounted on a surface of the substrate on the side close to the housing, while the microcomputer and the custom IC are mounted on the surface thereof on the side opposite to the side close to the housing. In a modification, an electronic component other than the heating elements may be mounted on a surface on either side of the substrate. Similarly, although the connector is fixed to the surface of the substrate on the side close to the housing, the connector may be fixed to the surface on the side opposite to the side close to the housing.

In the above-described embodiments, the capacitor, the relays, and the coil are large components accommodated in the accommodating room of the housing. In a modification, the large components accommodated in the accommodating room may not include some of the capacitor, the relays, and the coil, or may include a component other than the capacitor and the like. Such large components are mounted on the surface of the substrate on the side opposite to the side close to the housing without providing the accommodating room.
In the above-described embodiments, the substrate is divided into the power region and the control region. In a modification, the substrate may not be divided into the power region and the control region.
(E) Electronic Control Unit
In the above-described embodiments, the electronic control unit controls motor operation, and is connected to the motor by a harness or the like. In a modification, the electronic control unit may be formed integrally with the motor. In the above-described embodiments, the electronic control unit is used in an electromotive power steering system. In a modification, the electronic control unit may be used not only in the electromotive power steering system but also for controlling motor operation in other system, or for controlling a device other than the motor. The present disclosure is not limited to the above-described embodiments, and can be carried out in various modes within the scope without departing from the gist of the disclosure.

To sum up, the electronic control unit 1-4 of the above embodiments may be described as follows.

An electronic control unit 1-4 includes a substrate 10, a housing 50, a plurality of heating elements 21-25, and a radiating component 90. The substrate 10 is fixed to the housing 50. The plurality of heating elements 21-25 are mounted on a surface 11 of the substrate 10 on the housing 50-side. The radiating component 90 is provided between the plurality of heating elements 21-25 and the housing 50. A surface of the housing 50 on the substrate 10-side includes a plurality of accommodating recesses 71-75, a partitioning wall part 76, a peripheral wall part 52, and a plurality of buffer parts 81-85. In each of the plurality of accommodating recesses 71-75, a corresponding one of the plurality of heating elements 21-25 is accommodated. The partitioning wall part 76 separates the plurality of heating elements 21-25 from each other. The peripheral wall part 52 surrounds the plurality of accommodating recesses 71-75 and the partitioning wall part 76. Each of the plurality of buffer parts 81-85 is formed between a corresponding one of the plurality of accommodating recesses 71-75 and the peripheral wall part 52. Each of the plurality of buffer parts 81-85 is formed to be higher than a bottom part of a corresponding one of the plurality of accommodating recesses 71-75, and to be lower than the peripheral wall part 52.

In the embodiments, the heating elements 21-25 are each disposed in a space partitioned by the partitioning wall part 76 and the peripheral wall part 52. The radiating component 90 is therefore disposed in the space partitioned by the partitioning wall part 76 and the peripheral wall part 52; hence, the amount of the radiating component 90 can be decreased compared with the case where the partitioning wall part 76 and the peripheral wall part 52 are not provided. In addition, the buffer parts 81-85 are provided between the accommodating recesses 71-75 and the peripheral wall part 52, and the radiating component 90 does not flow out to the outside of the peripheral wall part 52.

The heating elements 21-25 are each disposed in the space partitioned by the partitioning wall part 76 and the peripheral wall part 52: hence, heat can be radiated to the housing 50 through the surface of each heating element 21-25 on a side opposite to a side close to the substrate 10 and through the peripheral side of the heating element 21-25, leading to improvement in heat radiation efficiency. This reduces interference of a magnetic field, making it possible to reduce noise.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control unit comprising:
   a substrate; a housing to which the substrate is fixed;
   a plurality of heating elements that are mounted on a surface of the substrate on the housing-side; and
   a radiating component that is provided between the plurality of heating elements and the housing, wherein:
   a surface of the housing on the substrate-side includes:
   a plurality of accommodating recesses in each of which a corresponding one of the plurality of heating elements is accommodated;
   a partitioning wall part that separates the plurality of healing elements from each other;
   a peripheral wall part that surrounds the plurality of accommodating recesses and the partitioning wall part; and
   a plurality of buffer parts each of which is a step and formed between a corresponding one of the plurality of accommodating recesses and the peripheral wall part; and
   wherein each of the plurality of buffer parts is formed to be higher than a bottom part of a corresponding one of the plurality of accommodating recesses, and to be lower than the peripheral wall part, with respect to a reference surface that is a surface of the housing opposite to the surface of the housing on the substrate-side, and
   wherein a distance from a surface of each of the plurality of buffer parts to the surface of the substrate on the housing-side in a thickness direction of the substrate is smaller than a distance from the bottom part of the corresponding one of the plurality of accommodating recesses to the surface of the substrate on the housing-side in the thickness direction of the substrate.

2. The electronic control unit according to claim 1, wherein the housing includes a plurality of substrate fixing parts that are in contact with the substrate, the unit further comprising a plurality of fixing components by each of which the substrate is fixed to a corresponding one of the plurality of substrate fixing parts, wherein the plurality of substrate fixing parts are formed to have the same height, and are formed to have such a height that the plurality of heating elements are separate from the housing in a state where the substrate is fixed to the housing.

3. The electronic control unit according to claim 2, wherein the peripheral wall part includes at least two of the plurality of substrate fixing parts.

4. The electronic control unit according to claim 2, wherein at least one of the plurality of substrate fixing parts that is formed at the peripheral wall part is provided at a position away from an outer edge of the substrate.

5. The electronic control unit according to claim 1, further comprising a large component excluding the plurality of heating elements, wherein:
   the housing includes an accommodating room in which the large component is accommodated; and
   a depth of each of the plurality of accommodating recesses is shallower than a depth of the accommodating room,
   wherein the large component is a component larger than each of the plurality of the heating elements.

6. The electronic control unit according to claim 1, further comprising a connector that is used for connection to an external component, wherein the connector is fixed on the surface of the substrate on the housing-side.

* * * * *